(12) United States Patent
Budge

(10) Patent No.: US 10,593,515 B2
(45) Date of Patent: Mar. 17, 2020

(54) PLASMA DRIVEN PARTICLE PROPAGATION APPARATUS AND PUMPING METHOD

(71) Applicant: Aurora Labs Limited, Applecross, Western Australia (AU)

(72) Inventor: David Budge, Applecross (AU)

(73) Assignee: Aurora Labs Limited, Bibra Lake (AU)

(*) Notice: Subject to any disclaimer, the term of this patent is extended or adjusted under 35 U.S.C. 154(b) by 0 days.

(21) Appl. No.: 15/738,634

(22) PCT Filed: Jun. 21, 2016

(86) PCT No.: PCT/AU2016/000214
§ 371 (c)(1),
(2) Date: Dec. 21, 2017

(87) PCT Pub. No.: WO2016/205857
PCT Pub. Date: Dec. 29, 2016

(65) Prior Publication Data
US 2018/0190471 A1    Jul. 5, 2018

(30) Foreign Application Priority Data

Jun. 23, 2015 (AU) ................................ 2015902421

(51) Int. Cl.
*H01J 37/301* (2006.01)
*H05H 1/54* (2006.01)
(Continued)

(52) U.S. Cl.
CPC .......... *H01J 37/301* (2013.01); *H01J 37/305* (2013.01); *H05H 1/2406* (2013.01); *H05H 1/54* (2013.01);
(Continued)

(58) Field of Classification Search
None
See application file for complete search history.

(56) References Cited

U.S. PATENT DOCUMENTS 5,504,340 A * 4/1996 Mizumura .......... H01J 37/3056
250/423 R
5,578,831 A * 11/1996 Hershcovitch ........ H01J 37/301
219/121.24
(Continued)

FOREIGN PATENT DOCUMENTS

JP    H0817377       1/1996
JP    H0817377 A     1/1996
(Continued)

OTHER PUBLICATIONS

Joel L Gersten et al The Physics and chemistry of Materials 2014.*
(Continued)

*Primary Examiner* — Alexander H Taningco
*Assistant Examiner* — Srinivas Sathiraju
(74) *Attorney, Agent, or Firm* — Andrus Intellectual Property Law, LLP

(57) ABSTRACT

A charged particle propagation apparatus has a generator including a vacuum chamber with a gun therein for discharging a charged particle beam through a beam exit. A higher pressure region adjoins the vacuum chamber at the beam exit and is maintainable at a pressure greater than a pressure of the vacuum chamber. A plasma interface located at the beam exit includes a plasma channel having at least three electrode plates disposed between its first end and its second end. A control system is adapted to apply a sequence of electrical currents to the electrode plates, which cause at least one plasma to move from the first end to the second end of the plasma channel, thereby pumping down the beam exit, and, in use, the charged particle beam is propagated from the (Continued)

vacuum chamber through the, or each, plasma into the higher pressure region.

18 Claims, 1 Drawing Sheet

(51) Int. Cl.
    *H01J 37/305*     (2006.01)
    *H05H 1/24*     (2006.01)

(52) U.S. Cl.
    CPC ............... *H01J 2237/3132* (2013.01); *H05H 2001/2412* (2013.01)

(56) References Cited

U.S. PATENT DOCUMENTS

| | | | | |
|---|---|---|---|---|
| 5,583,344 | A * | 12/1996 | Mizumura | H01J 37/3056 250/423 R |
| 5,821,705 | A * | 10/1998 | Caporaso | H05H 7/00 315/507 |
| 5,825,035 | A * | 10/1998 | Mizumura | H01J 37/3056 250/423 R |
| 6,465,965 | B2 * | 10/2002 | Nelson | G21H 1/02 315/111.81 |
| 6,819,053 | B2 * | 11/2004 | Johnson | H01J 27/16 118/723 I |
| 7,576,499 | B2 * | 8/2009 | Caporaso | H05H 7/00 315/500 |
| 7,709,792 | B2 * | 5/2010 | Naser-Ghodsi | H01J 37/28 250/307 |
| 8,373,352 | B2 * | 2/2013 | Doughty | H01J 65/044 315/185 S |
| 9,029,812 | B2 * | 5/2015 | Smith | C23C 14/0031 250/423 F |
| 9,111,715 | B2 * | 8/2015 | Parker | H01J 37/05 |
| 9,153,414 | B2 * | 10/2015 | Slingerland | H01J 37/18 |
| 9,328,976 | B1 * | 5/2016 | Lasko | F28F 21/08 |
| 9,401,262 | B2 * | 7/2016 | Smith | C23C 14/0031 |
| 9,466,464 | B1 * | 10/2016 | Lam | H01J 37/305 |
| 9,881,817 | B1 * | 1/2018 | Lam | H01L 21/0262 |
| 9,934,944 | B2 * | 4/2018 | Akita | H01J 37/32541 |
| 2003/0074096 | A1 | 4/2003 | Das et al. | |
| 2006/0000986 | A1 * | 1/2006 | Kumar | G02F 1/13378 250/492.3 |
| 2009/0206065 | A1 | 8/2009 | Kruth et al. | |
| 2009/0288773 | A1 * | 11/2009 | Bolden, II | H01J 37/3244 156/345.33 |
| 2011/0043123 | A1 * | 2/2011 | Gilliard | H01J 65/042 315/248 |
| 2013/0108726 | A1 | 5/2013 | Uckelmann et al. | |
| 2014/0158047 | A1 * | 6/2014 | Furuya | H01J 37/3266 118/723 E |
| 2015/0053866 | A1 * | 2/2015 | Aramaki | H01J 37/08 250/423 R |
| 2015/0360463 | A1 * | 12/2015 | Sadwick | H01J 23/165 347/110 |
| 2018/0190471 | A1 * | 7/2018 | Budge | H05H 1/54 |

FOREIGN PATENT DOCUMENTS

| | | |
|---|---|---|
| JP | H0922347 A | 8/1997 |
| JP | H09223474 | 8/1997 |
| WO | 2014096755 | 6/2014 |

OTHER PUBLICATIONS

International Search Report, PCT/AU2016/000214, dated Aug. 22, 2016.
Written Opinion, PCT/AU2016/000214, dated Aug. 22, 2016.
International Preliminary Report on Patentability, PCT/AU2016/000214, dated Aug. 22, 2016.

* cited by examiner

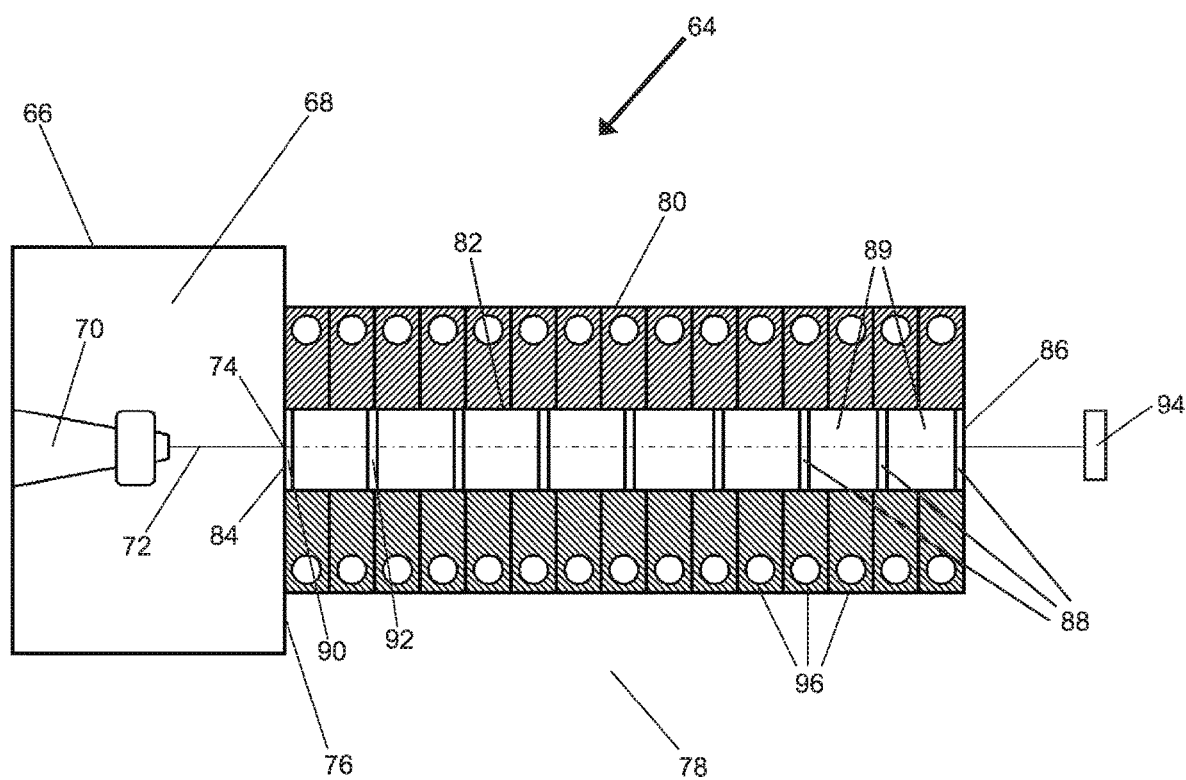

PLASMA DRIVEN PARTICLE PROPAGATION APPARATUS AND PUMPING METHOD

CROSS-REFERENCE TO RELATED APPLICATIONS

This application is the U.S. national stage application of International Application PCT/AU2016/000214, filed Jun. 21, 2016, which international application was published on Dec. 29, 2016, as International Publication WO 2016/205857 in the English language. The International Application claims priority of Australia Patent Application No. 2015902421, filed Jun. 23, 2015. The international application and Australian application are both incorporated herein by reference, in entirety.

FIELD OF INVENTION

The present invention relates to a plasma driven particle propagation apparatus and pumping method.

BACKGROUND ART

Three-dimensional (3D) printed parts result in a physical object being fabricated from a 3D digital image by laying down consecutive thin layers of material.

Typically these 3D printed parts can be made by a variety of means, such as selective laser melting or sintering, which operate by having a powder bed onto which an energy beam is projected to melt the top layer of the powder bed so that it welds onto a substrate or a substratum. This melting process is repeated to add additional layers to the substratum to incrementally build up the part until completely fabricated.

These printing methods are significantly time consuming to perform and it may take several days, or weeks, to fabricate a reasonable sized object. The problem is compounded for complex objects comprising intricate component parts. This substantially reduces the utility of 3D printers and is one of the key barriers currently impeding large-scale adoption of 3D printing by consumers and in industry.

Power is also a significant limiting factor for existing 3D printing methods and devices.

Whilst selective electron beam melting can be used as a powerful material fabrication method, this must typically be performed in a vacuum because interaction between charged particle beams and air molecules at atmospheric pressure causes dispersion and attenuation of the beams, significantly impairing their power. It is, therefore, known to use an assembly comprising a high-powered electron gun (for example, a 150 kW electron gun) contained inside a first vacuum housing that is adjoined to a second vacuum housing containing a workpiece to be operated on. Such assemblies, however, result in low productivity rates due to the required pumping time for evacuating the housings. The practical size of the workpiece that may be contained inside the second housing is also substantially limited.

It is, therefore, also known to use a plasma window in conjunction with a high-powered electron gun to perform material fabrication work. Such an assembly comprises an electron gun contained in a vacuum chamber, wherein the vacuum chamber is adjoined to a region of higher pressure (such as atmospheric pressure) containing a workpiece. A beam of charged particles is discharged from within the vacuum chamber and out of the chamber via a beam exit disposed in a wall of the chamber.

A plasma interface is disposed at the beam exit comprising an elongate channel for bonding a plasma. A plasma-forming gas, such as helium, argon or nitrogen, that is highly ionized, is injected into the channel. Electrical currents are applied to a cathode and an anode disposed at opposite ends of the channel which causes a plasma to form and bond statically between the cathode and anode. The plasma serves to prevent pressure communication between the higher pressure region and the vacuum chamber whilst permitting substantially unhindered propagation of charged particles from the vacuum chamber to the higher pressure region, via the channel, and onto the workpiece.

Whilst plasma interfaces constructed in the above manner also serve to pump down the vacuum chamber, this pumping action is weak and of limited effectiveness only. In practice, both the vacuum chamber and the plasma interface's channel must be pumped such that they are substantially in vacuum prior to the formation of the plasma. This is time consuming and, to implement effectively, requires equipment that is costly and mechanically cumbersome. Particle gun assemblies that comprise plasma interfaces constructed in this manner are, therefore, not well suited for 3D printing apparatuses, where the gun assembly is required to be dexterous and flexible in operation.

OBJECT OF THE INVENTION

It is an object of the present invention to provide a charged particle propagation apparatus having a vacuum chamber and plasma interface, wherein the plasma interface serves to pump down the vacuum chamber effectively.

SUMMARY OF THE INVENTION

In accordance with one further aspect of the present invention, there is provided a charged particle propagation apparatus comprising a:
  generator comprising a vacuum chamber with a gun therein for discharging a charged particle beam from within the vacuum chamber and out of the vacuum chamber through a beam exit disposed in a wall of the vacuum chamber;
  higher pressure region adjoining the vacuum chamber at the beam exit that is maintainable at a pressure greater than a pressure of the vacuum chamber;
  plasma interface disposed at the beam exit comprising a plasma channel, wherein the plasma channel:
    is aligned with the beam exit;
    has a first end and a second end; and
    has at least three electrode plates disposed between the first end and the second end,
  and a control system adapted to apply a sequence of electrical currents to the electrode plates,
whereby the sequence of electrical currents is configured to cause at least one plasma to move from the first end to the second end of the plasma channel thereby pumping down the beam exit, and, in use, the charged particle beam is propagated from the vacuum chamber through the, or each, plasma in the plasma channel and into the higher pressure region.

The sequence of electrical currents may be configured to cause a plurality of plasmas to move concurrently from the first end to the second end of the plasma channel.

A non-plasma region may be formed between two successive plasmas moving concurrently from the first end to the second end of the plasma channel.

The, or each, non-plasma region may contain residual gas from the vacuum chamber.

The sequence of electrical currents may be a repeating sequence that causes the beam exit to be pumped down continuously.

The plasma channel may further comprise a plurality of insulators, each insulator being made of a suitable insulating material and being disposed between a pair of adjacent electrode plates in the plasma channel and having a central aperture coaxially aligned with the plasma channel which the charged particle beam may pass there through.

Each insulator may be made of aluminium oxide.

Each insulator may be made of high-density polyethylene.

Each insulator may be made of mica.

Each insulator may be made of polytetrafluoroethylene.

The higher pressure region may be maintained at atmospheric pressure.

The charged particle propagation apparatus may further comprise an injection means for injecting a plasma-forming gas into the plasma channel.

The injection means may comprise a supply tube and mechanical gas pump.

The plasma-forming gas may be a inert or non-inert plasma-forming gas.

The plasma-forming gas may be helium.

The plasma-forming gas may be argon.

The plasma-forming gas may be nitrogen.

The charged particle propagation apparatus may further comprise a means for stabilizing the, or each, plasma in the plasma channel, the stabilizing means comprising a plurality of stacked annular cooling plates collectively having a central bore defining the plasma channel there through, and means for circulating cooling fluid through the cooling plates to remove heat therefrom.

In accordance with one further aspect of the present invention, there is provided a pumping method for pumping down a vacuum chamber comprising the steps of:
  disposing a plasma interface at an exit of the vacuum chamber comprising a plasma channel, wherein the plasma channel:
    is aligned with the exit;
    has a first end and a second end; and
    has at least three electrode plates disposed between the first end and the second end,
  and applying a sequence of electrical currents to the electrode plates, the sequence of electrical currents being configured to cause at least one plasma to move from the first end to the second end of the plasma channel thereby pumping down the exit.

The pumping method may comprise the additional step of applying a further sequence of electrical currents to the electrode plates causing a plurality of plasmas to move concurrently from the first end to the second end of the plasma channel.

The sequence of electrical currents used in the pumping method may cause a non-plasma region to be formed between two successive plasmas moving concurrently from the first end to the second end of the plasma channel.

Residual gas from the vacuum chamber may be contained in the, or each, non-plasma region formed when the pumping method is executed.

The sequence of electrical currents used in the pumping method may be repeated causing the exit to be pumped down continuously.

BRIEF DESCRIPTION OF DRAWINGS

The present invention will now be described, by way of example, with reference to the accompanying drawings, in which FIG. 1 is a schematic view of a charged particle propagation apparatus according to a preferred embodiment of the invention.

DETAILED DESCRIPTION OF THE DRAWINGS

Referring to FIG. 1, there is shown a charged particle propagation apparatus 64 according to a preferred embodiment of the invention.

The particle propagation apparatus 64 comprises a generator 66 comprising a vacuum chamber 68. Inside the vacuum chamber 68, there is disposed a gun 70 for discharging a charged particle beam 72. The gun 70 may, for example, comprise a high-powered 150 kW electron beam gun.

As shown in the FIGURE, the charged particle beam 72 is discharged from within the vacuum chamber 68 and out of the vacuum chamber 68 through a beam exit 74 disposed in a wall 76 of the vacuum chamber 68.

A region of higher pressure 78 adjoins the vacuum chamber 68 which is maintainable at a pressure greater than a pressure of the vacuum chamber 68. Preferably, the region of higher pressure 78 is maintained at atmospheric pressure.

A plasma interface 80 is disposed at the beam exit 74 that comprises a plasma channel 82. Preferably, the plasma channel 82 is substantially aligned with the beam exit 74 such that the particle beam 72 may pass through an elongate length of the plasma channel 82.

The plasma channel 82 has a first end 84 and second end 86 and a plurality of electrode plates 88 are disposed between the first end 84 and the second end 86. Each electrode plate 88 has a central aperture (not shown) coaxially aligned with the plasma channel 82 which the particle beam 72 may pass there through.

Each electrode plate 88 is, preferably, separated from the others in the plurality by an insulator 89 disposed between adjacent electrode plates 88. Each insulator 89 also has a central aperture (not shown) coaxially aligned with the plasma channel 82 which the particle beam 72 may also pass there through.

Each insulator 89 is made from a material having electrical insulating properties such as, for example, aluminium oxide, high-density polyethylene, mica or polytetrafluoroethylene. The dimensions of each insulator 89 is adapted to minimise the distance between adjacent electrodes plates 88 while preventing electrical interference between the electrodes plates 88.

In the exemplary embodiment shown in the FIGURE, the plasma channel 82 comprises a total of nine electrode plates 88. However, it will be appreciated that an alternative number of plates may be used, provided always that a minimum of three plates must be used.

A plasma-forming gas, such as helium, argon or nitrogen, that is highly ionized and contains positive ions and electrons, is injected into the plasma channel 82 using an injection means known in the art such as, for example, a supply tube and mechanical gas pump (not shown).

Once the gas has sufficiently filled the plasma channel 82, electrical currents are applied to the electrode plates 88 using a control system that is incorporated into the particle propagation apparatus 64. The electrical currents cause a first plasma to form at the first end 84 of the plasma channel 82 and be maintained at a high pressure, which may be atmospheric pressure, for example. This is achieved by supplying a high voltage, low current power supply to a first plate 90, thus causing the first plate 90 to form a cathode, followed by supplying a low voltage, high current power supply to a second plate 92, thus causing the second plate 92 to form an anode. The opposing cathode and anode causes a plasma to form and bond between the first plate 90 and the second plate 92.

The control system then selectively applies a pre-determined sequence of electrical currents to the other electrode plates 88 in the channel 82. The sequence of electrical currents is configured to cause the first plasma to move from the low pressure region at the first end 84 of the plasma channel 82 to the high pressure region at the second end 86 of the plasma channel 82.

After the first plasma has propagating through the plasma channel 82 towards its second end 86 by a sufficient distance, further electrical currents are then applied to the first and second electrode plates 90,92 causing a second plasma to form at the first end 84 of the plasma channel 82. The second plasma is then, similarly, propagated through the plasma channel 82 towards its second end 86 by a sequence electrical currents being selectively applied to the other electrode plates 88.

This process is, preferably, repeated thereby causing further plasmas to be generated and travel simultaneously along the elongate length of the plasma channel 82 in succession.

The movement of the, or each, plasma through the plasma channel 82 towards its second end 86 in this manner advantageously causes a substantial pumping down to occur at the beam exit 74. This process is used to create the vacuum in the vacuum chamber 68 rapidly and maintain the vacuum once formed.

Further, the sequence of electrical currents that is applied to the electrode plates 88 is, preferably, configured such that a non-plasma region is formed between each pair of plasmas traveling concurrently along the elongate length of the plasma channel 82.

In embodiments of the invention wherein the plasma channel 82 comprises a high number of electrode plates 88, it will be appreciated that a high number of plasmas, and corresponding non-plasma regions, will be caused to travel simultaneously along the elongate length of the plasma channel 82.

The, or each, non-plasma region travelling along the plasma channel 82, preferably, contains residual gas from the vacuum chamber. This substantially increases the power and effectiveness of the pumping down that is performed at the beam exit 74.

In use, the particle beam 72 propagates from the vacuum chamber 68, through the beam exit 74 and through the, or each, plasma that may be present in the plasma channel 82, without dispersion or attenuation, and onto a workpiece 94 disposed in the region of higher pressure 78. This arrangement provides for substantially unhindered transmission of charged particles from the gun 70 to the workpiece 94.

Each plasma that is formed within, and propagating through, the plasma channel 82 may reach a high temperature of approximately 15,000° K. Stabilizing means are, therefore, used to stabilize each plasma preferably by providing a lower temperature boundary around each plasma. The stabilizing means, preferably, comprises a plurality of coaxially stacked together annular cooling plates 96 with the plates 96 collectively having a central bore which defines the plasma channel 82 therethrough.

Cooling fluid or gas is circulated under pressure through each of the cooling plates 96 for removing heat therefrom for stablishing a lower temperature boundary around each plasma. During operation, heat is transmitted radially outwardly by conduction through the cooling plates 96 and is removed by the cooling fluid circulating therethrough. Accordingly, by circulating the cooling fluid or gas around the plasma channel 82, heat is removed therefrom for stabilising each plasma.

Modifications and variations as would be apparent to a skilled addressee are deemed to be within the scope of the present invention.

In the claims that follow and in the preceding description of the invention, except where the context requires otherwise due to express language or necessary implication, the word "comprise" or variations such as "comprises" or "comprising" are used in an inclusive sense, i.e. to specify the presence of the stated features but not to preclude the presence or addition of further features in various embodiments of the invention.

The invention claimed is:

1. A charged particle propagation apparatus for a selective heating process, the charged particle propagation apparatus comprising:
   a generator comprising a vacuum chamber with a gun therein for discharging a charged particle beam from within the vacuum chamber and out of the vacuum chamber through a beam exit disposed in a wall of the vacuum chamber;
   a higher pressure region adjoining the vacuum chamber at the beam exit that is maintainable at a pressure greater than a pressure of the vacuum chamber;
   a plasma interface disposed at the beam exit comprising a plasma channel, wherein the plasma channel:
   is aligned with the beam exit;
   has a first end and a second end;
   has at least three electrode plates disposed successively along an axis of the plasma channel between the first end and the second end; and
   a plurality of insulators, each insulator being disposed between a pair of adjacent electrode plates in the plasma channel and having a central aperture coaxially aligned with the plasma channel which the charged particle beam may pass there through;
   wherein the apparatus is configured to apply a sequence of electrical currents to the electrode plates causing each plate to behave selectively as either an anode or cathode thereby causing a plurality of plasmas to move concurrently from the first end to the second end of the plasma channel thereby pumping down the beam exit, and, in use, the charged particle beam is propagated from the vacuum chamber through each plasma in the plasma channel and into the higher pressure region to selectively heat a work piece.

2. The charged particle propagation apparatus according to claim 1, wherein the sequence of electrical currents is configured to cause a non-plasma region to be formed between two successive plasmas moving concurrently from the first end to the second end of the plasma channel.

3. The charged particle propagation apparatus according to claim 2, wherein the, or each, non-plasma region contains residual gas from the vacuum chamber.

4. The charged particle propagation apparatus according to claim 1, wherein the sequence of electrical currents is a repeating sequence that causes the beam exit to be pumped down continuously.

5. The charged particle propagation apparatus according to claim 1, wherein each insulator is made of aluminum oxide.

6. The charged particle propagation apparatus according to claim 1, wherein each insulator is made of high-density polyethylene.

7. The charged particle propagation apparatus according to claim 1, wherein each insulator is made of mica.

8. The charged particle propagation apparatus according to claim 1, wherein each insulator is made of polytetrafluoroethylene.

9. The charged particle propagation apparatus according to claim 1, wherein the higher pressure region is maintained at atmospheric pressure.

10. The charged particle propagation apparatus according to claim 1, wherein each electrode plate comprises a central aperture coaxially aligned with the plasma channel which the charged particle beam may pass there through.

11. The charged particle propagation apparatus according to claim 1, further comprising an injection means for injecting a plasma-forming gas into the plasma channel.

12. The charged particle propagation apparatus according to claim 11, wherein the injection means comprises a supply tube and mechanical gas pump.

13. The charged particle propagation apparatus according to claim 11, wherein the plasma-forming gas is helium.

14. The charged particle propagation apparatus according to claim 11, wherein the plasma-forming gas is argon.

15. The charged particle propagation apparatus according to claim 11, wherein the plasma-forming gas is nitrogen.

16. The charged particle propagation apparatus according to claim 1, further comprising a means for stabilizing the, or each, plasma in the plasma channel, the stabilizing means comprising a plurality of stacked annular cooling plates collectively having a central bore defining the plasma channel there through, and means for circulating cooling fluid through the cooling plates to remove heat therefrom.

17. A pumping method for pumping down a vacuum chamber during a selective charged particle heating process, the pumping method comprising the steps of:
   disposing a plasma interface at an exit of the vacuum chamber comprising a plasma channel, wherein the plasma channel:
   is aligned with the exit;
   has a first end and a second end;
   has at least three electrode plates disposed successively along an axis of the plasma channel between the first end and the second end; and
   has a plurality of insulators, each insulator being disposed between a pair of adjacent electrode plates in the plasma channel and having a central aperture coaxially aligned with the plasma channel which the charged particle beam may pass there through; and
   applying a sequence of electrical currents to the electrode plates, wherein the sequence of electrical currents are configured to cause each plate to behave selectively as either an anode or cathode thereby causing a plurality of plasmas to move concurrently from the first end to the second end of the plasma channel thereby pumping down the exit during a selective charged particle heating process.

18. The pumping method according to claim 17, wherein the sequence of electrical currents used in the pumping method are repeated thereby causing the exit to be pumped down continuously.

* * * * *